US006614398B2

(12) United States Patent
Kushihi et al.

(10) Patent No.: US 6,614,398 B2
(45) Date of Patent: Sep. 2, 2003

(54) ANTENNA STRUCTURE AND COMMUNICATION APPARATUS INCLUDING THE SAME

(75) Inventors: Yuichi Kushihi, Kanazawa (JP); Junichi Kurita, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/121,733

(22) Filed: Apr. 15, 2002

(65) Prior Publication Data

US 2002/0167448 A1 Nov. 14, 2002

(30) Foreign Application Priority Data

May 8, 2001 (JP) ....................................... 2001-137571

(51) Int. Cl.[7] ................................................. H01Q 1/38
(52) U.S. Cl. ............................... 343/700 MS; 343/702
(58) Field of Search .......................... 343/700 MS, 702, 343/745

(56) References Cited

U.S. PATENT DOCUMENTS 6,300,909 B1 * 10/2001 Tsubaki et al. ...... 343/700 MS

FOREIGN PATENT DOCUMENTS

JP 10-173426 6/1998

* cited by examiner

*Primary Examiner*—Michael C. Wimer
(74) *Attorney, Agent, or Firm*—Keating & Bennett, LLP

(57) ABSTRACT

An antenna structure includes a surface-mounted antenna which has a base member. A radiating electrode and an antenna-side control electrode are disposed on the base member. A capacitance is generated between the antenna-side control electrode and an open end of the radiating electrode, and the antenna-side control electrode electrically floats. A board-side control electrode which is electrically connected with the antenna-side control electrode and which electrically floats is disposed on a mounting board. The board-side control electrode is connected with a ground conductor at high frequencies through a resonant frequency adjuster. The resonant frequency adjuster has a capacitance or an inductance. By changing the capacitance or the inductance, the resonant frequency of the radiating electrode can be changed without changing the surface-mounted antenna.

15 Claims, 9 Drawing Sheets

ANTENNA STRUCTURE AND COMMUNICATION APPARATUS INCLUDING THE SAME

BACKGROUND OF THE INVENTION

1. Field of the Invention

The present invention relates to communication apparatuses, such as mobile communication apparatuses, and to antenna structures included in such apparatuses.

2. Description of the Related Art

One type of small antenna provided in mobile communication apparatuses, such as mobile telephones and GPS (Global Positioning System) apparatuses, is a surface-mounted antenna that is produced by forming a radiating electrode on a dielectric or magnetic base member. The radio-wave transmission/reception frequency of the surface-mounted antenna, that is, the resonant frequency of the radiating electrode, is determined by the complex relationship among various factors including the size of the base member, the dielectric constant of the base member when the base member is made of dielectric material, and the size and the shape of the radiating electrode.

When changing the radio-wave transmission/reception frequency of the surface-mounted antenna, that is, when changing the resonant frequency of the radiating electrode, a great amount of time and labor is required to design the surface-mounted antenna. As a result, the cost of the surface-mounted antenna increases.

An antenna structure 1 such as that shown in FIG. 10A is proposed. The antenna structure 1 contains a surface-mounted antenna 2, a board-side control electrode 4 disposed on a mounting board 3 (a circuit board of a communication apparatus), a switch circuit 5, and a ground conductor 6. The surface-mounted antenna 2 is a λ/4 transmission line type and is formed by a dielectric or magnetic base member 7, a radiating electrode 8, a ground electrode 9, a feeding electrode 10, and an antenna-side control electrode 11.

In the surface-mounted antenna 2, the ground electrode 9 is disposed on a bottom surface 7*b* of the base member 7, and the radiating electrode 8 is arranged to extend from a side surface 7*f* to a top surface 7*a*. A first end of the radiating electrode 8 communicates and connects with the ground electrode 9, thus defining a ground end. A second end of the radiating electrode 8 defines an open end 8*a*. A portion of the open end 8*a* extends from the top surface 7*a* to the side surface 7*d* of the base member 7.

A first end of the antenna-side control electrode 11 opposes the extended portion of the open end 8*a* with a gap therebetween. A capacitance is generated between the open end 8*a* of the radiating electrode 8 and the antenna-side control electrode 11. A second end of the antenna-side control electrode 11 is arranged such that it wraps around the side surface 7*d* to the bottom surface 7*b* of the base member 7. The second end of the antenna-side control electrode 11 opposes the ground electrode 9 with a gap therebetween. The antenna-side control electrode 11 electrically floats.

The feeding electrode 10 is arranged to extend from the bottom surface 7*b* through the side surface 7*d* to the top surface 7*a* of the base member 7. A top end of the feeding electrode 10 opposes the open end 8*a* of the radiating electrode 8 with a gap therebetween. A second end of the feeding electrode 10 opposes the ground electrode 9 with a gap therebetween.

On the mounting board 3, a region in which the surface-mounted antenna 2 is mounted is a groundless portion in which the ground conductor 6 is not provided. The board-side control electrode 4, which electrically floats, and the switch circuit 5 are disposed on the groundless portion. A signal supply source 12 is disposed on the mounting board 3. A feeding wiring pattern 13 which is electrically connected with the signal supply source 12 is provided on the groundless portion.

In order to mount the surface-mounted antenna 2 on the mounting board 3, the surface-mounted antenna 2 is mounted on the groundless portion of the mounting board 3 so that the antenna-side control electrode 11 of the surface-mounted antenna 2 is electrically connected with the board-side control electrode 4 of the mounting board 3, so that the board-side control electrode 4 and the antenna-side control electrode 11 electrically float, and such that the feeding electrode 10 of the surface-mounted antenna 2 is electrically connected with the feeding wiring pattern 13 of the mounting board 3.

In this state, when the signal supply source 12 supplies a signal through the feeding wiring pattern 13 to the feeding electrode 10 of the surface-mounted antenna 2, the signal is transferred from the feeding electrode 10 to the radiating electrode 8 by capacitive coupling, and the radiating electrode 8 is excited. Thus, radio waves can be transmitted or received.

FIG. 10B shows an equivalent circuit diagram of the antenna structure 1. Referring to FIG. 10B, L denotes the inductance of the radiating electrode 8, R1 denotes the radiation resistance of the radiating electrode 8, R2 denotes the internal resistance of the radiating electrode 8, C1 denotes the capacitance between the open end 8*a* of the radiating electrode 8 and the antenna-side control electrode 11, C2 denotes the capacitance between the open end 8*a* of the radiating electrode 8 and the feeding electrode 10, and C3 denotes the capacitance between the radiating electrode 8 and the ground.

In the antenna structure 1, when the switch circuit 1 is switched on and when the board-side control electrode 4 is grounded through the switch circuit 5, the capacitance C1 between the open end 8*a* of the radiating electrode 8 and the board-side control electrode 4 influences the resonant frequency of the radiating electrode 8. In contrast, when the switch circuit 5 is switched off, the capacitance C1 does not influence the resonant frequency of the radiating electrode 8. Accordingly, the influence of the capacitance C1 on the radiating electrode 8 varies according to whether or not the switch circuit 5 is switched on or off, and hence the resonant frequency of the radiating electrode 8 varies.

In the antenna structure 1 arranged as described above, the resonant frequency of the radiating electrode 8 can be easily changed by switching the switch circuit 5 on or off without changing the size and the shape of the radiating electrode 8 of the surface-mounted antenna 2 or the size of the base member 7.

In the antenna structure 1, the structure of the switch circuit 5 is complex, and the switch circuit 5 is expensive. Thus, the antenna structure 1 is not commercially feasible.

SUMMARY OF THE INVENTION

In order to solve the foregoing problems, preferred embodiments of the present invention provide an antenna structure which has a simple configuration and which is capable of easily changing the resonant frequency of a radiating electrode without changing a surface-mounted antenna. In addition, preferred embodiments of the present invention provide a communication apparatus including such a novel antenna structure.

In order to achieve the foregoing advantages, preferred embodiments of the present invention, an antenna structure includes a surface-mounted antenna including a radiating electrode disposed on a base member, the surface-mounted antenna being a λ/4 transmission line type, a first end of the radiating electrode being a ground end and a second end of the radiating electrode being an open end, a mounting board on which the surface-mounted antenna is mounted, an antenna-side control electrode disposed on the base member of the surface-mounted antenna, the antenna-side control electrode having a capacitance generated between itself and the open end of the radiating electrode, a ground conductor disposed on the mounting board and which functions as ground, a board-side control electrode disposed on the mounting board, which is electrically connected with the antenna-side control electrode, and which electrically floats, and a resonant frequency adjuster having at least one of an inductance and a capacitance. The board-side control electrode is electrically connected with the ground conductor through the resonant frequency adjuster.

The resonant frequency adjuster may include at least one of or a combination of at least two of a chip inductor component, a chip capacitor component, an inductor pattern, and a capacitor pattern.

According to another preferred embodiment of the present invention, an antenna structure includes a surface-mounted antenna including a radiating electrode disposed on a base member, the surface-mounted antenna being a λ/4 transmission line type, a first end of the radiating electrode being a ground end and a second end of the radiating electrode being an open end, a mounting board, on which the surface-mounted antenna is mounted, an antenna-side control electrode disposed on the base member of the surface-mounted antenna, the antenna-side control electrode having a capacitance that is generated between itself and the open end of the radiating electrode, a ground conductor disposed on the mounting board and which functions as ground, a board-side control electrode disposed on the mounting board, which is electrically connected with the antenna-side control electrode, and which electrically floats, and a resonant frequency adjuster including a solder bridge connecting the board-side control electrode and the ground conductor or a strip line. The board-side control electrode is electrically connected with the ground conductor at high frequencies through the resonant frequency adjuster.

According to yet another preferred embodiment of the present invention, an antenna structure includes a surface-mounted antenna including a radiating electrode disposed on a base member, the surface-mounted antenna being a λ/4 transmission line type, a first end of the radiating electrode being a ground end and a second end of the radiating electrode being an open end, a mounting board on which the surface-mounted antenna is mounted, an antenna-side control electrode disposed on the base member of the surface-mounted antenna, the antenna-side control electrode having a capacitance that is generated between itself and the open end of the radiating electrode, a ground conductor disposed on the mounting board and which functions as ground, a board-side control electrode disposed on the mounting board, which is electrically connected with the antenna-side control electrode and which electrically floats, a resonant frequency adjuster including a varicap diode, the board-side control electrode being electrically connected with the ground conductor at high frequencies through the resonant frequency adjuster, and a connection section connecting to a voltage supply source for applying a voltage to the varicap diode.

A plurality of antenna-side control electrodes may be disposed on the base member of the surface-mounted antenna. Board-side control electrodes corresponding to the antenna-side control electrodes may be disposed on the mounting board. The board-side control electrodes may be electrically connected with the ground conductor at high frequencies through separate resonant frequency adjusters.

According to a further preferred embodiment of the present invention, a communication apparatus includes an antenna structure according to preferred embodiments of the present invention described above.

According to preferred embodiments of the present invention described as above, the open end of the radiating electrode is connected at high frequencies to the ground conductor (ground) through the capacitance between the open end of the radiating electrode and the antenna-side control electrode, the antenna-side control electrode, the board-side control electrode, and the resonant frequency adjuster. The resonant frequency adjuster is preferably disposed on the mounting board. By changing the impedance between the open end of the radiating electrode and the ground using the resonant frequency adjuster, the resonant frequency of the radiating electrode can be changed. Without changing the design of the surface-mounted antenna, the resonant frequency of the radiating electrode can be easily changed by the resonant frequency adjuster. Accordingly, when the need to change the resonant frequency of the radiating electrode arises, the demand can be immediately satisfied.

The resonant frequency adjuster may be defined by and include a chip inductor component, a chip capacitor component, an inductor pattern, a capacitor pattern, a solder bridge, a strip line, a varicap diode, or other suitable element. Since the configuration of such a component is much simpler than a switch circuit illustrated in a proposed example, the antenna structure can be simplified.

According to preferred embodiments of the present invention, an antenna structure is preferably constructed by mounting a λ/4 transmission line type surface-mounted antenna on a mounting board. The impedance between an open end of a radiating electrode and ground is changed by a resonant frequency adjuster on the mounting board, thereby changing the resonant frequency of the radiating electrode. Accordingly, the resonant frequency of the radiating electrode can be easily changed without changing the surface-mounted antenna.

When the need to change the resonant frequency of the radiating electrode arises, the need can be immediately satisfied without devoting a large amount of time and labor to design the antenna structure. An increase in cost of the antenna structure due to the design is therefore minimized, and hence the antenna can be provided at a low cost. Since the configuration of the resonant frequency adjuster can be simplified, complications in the design, manufacture and performance of the antenna structure are reliably prevented.

For these reasons, according to a communication apparatus including the antenna structure of preferred embodiments of the present invention, the cost of the communication apparatus can be reduced since the antenna structure is simple and the cost of the antenna is reduced.

A plurality of antenna-side control electrodes is disposed on the surface-mounted antenna. Board-side control electrodes corresponding to the antenna-side control electrodes are disposed on the mounting board. The board-side control electrodes are electrically connected with a ground conductor at high frequencies through separate resonant frequency adjusters. The impedance between the open end of the radiating electrode and the ground can be finely adjusted by each resonant frequency adjuster. Accordingly, it becomes even easier to adjust the resonant frequency of the radiating electrode.

Other features, elements, characteristics and advantages of the present invention will become apparent from the following detailed description of preferred embodiments with reference to the attached drawings.

DETAILED DESCRIPTION OF PREFERRED EMBODIMENTS

Referring to the accompanying drawings, the present invention will become clear from the following description of the preferred embodiments.

Figure 1:
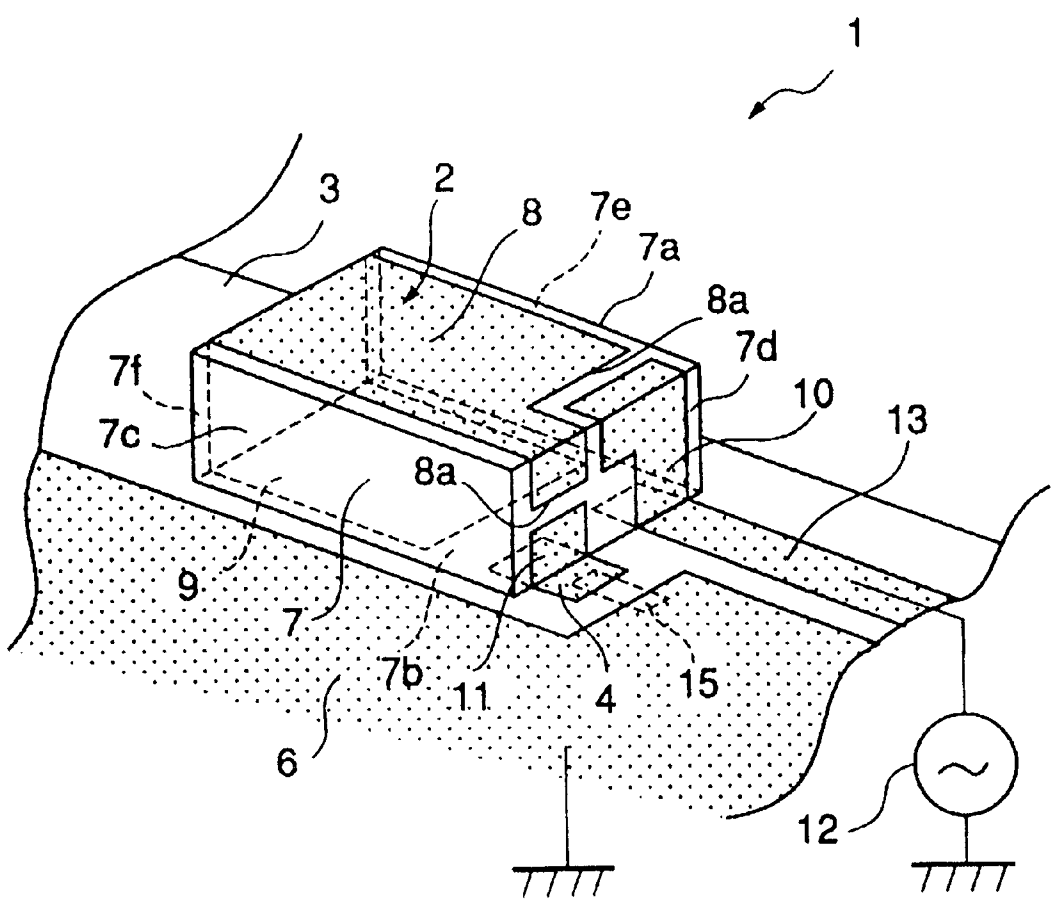
FIG. 1 is a model diagram of a first preferred embodiment of an antenna structure included in a communication apparatus according to the present invention.

FIG. 1 schematically shows an antenna structure, which is a feature of a communication apparatus according to a first preferred embodiment of the present invention. The communication apparatus can have various configurations. In the first preferred embodiment, the configuration of the communication apparatus excluding the antenna structure, which is described below, can have any configuration. A description of the communication apparatus excluding the antenna structure is omitted.

Figure 10A:
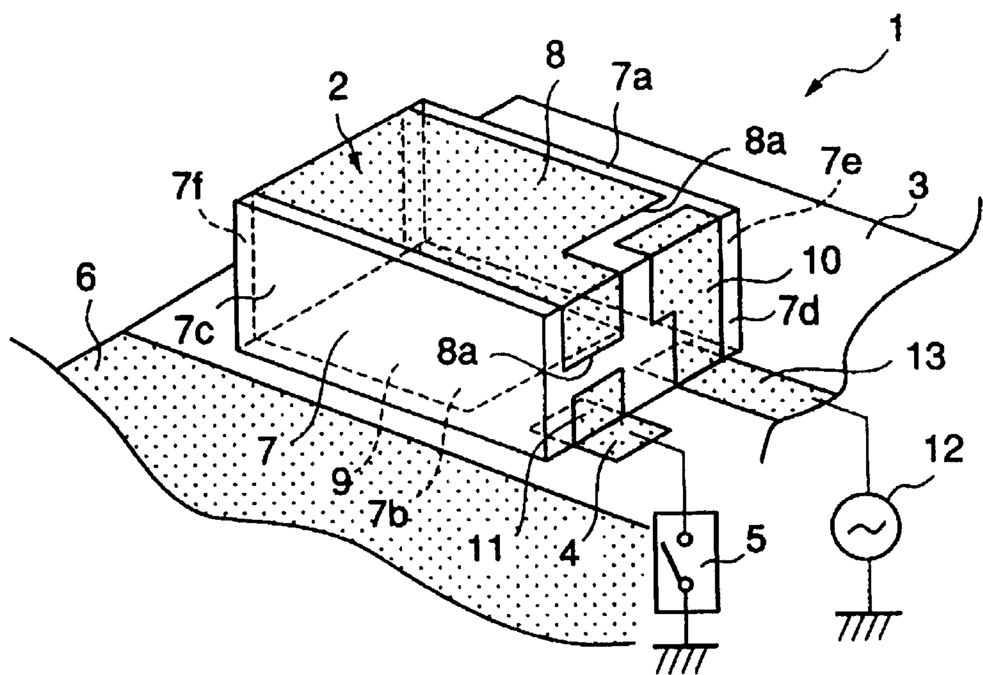
FIG. 10A is a model diagram of a proposed example of an antenna structure in which the resonant frequency of a radiating electrode can be changed.

An antenna structure 1 of the first preferred embodiment has a feature in that a board-side control electrode 4 on a mounting board 3 and a ground conductor 6 are electrically connected with each other at high frequencies through a resonant frequency adjuster 15. The remaining configuration is substantially similar to that of a proposed example shown in FIG. 10A. In the description of the first preferred embodiment, the same reference numerals are assigned to elements corresponding to those of the proposed example, and descriptions of the common elements are omitted.

Figure 2:
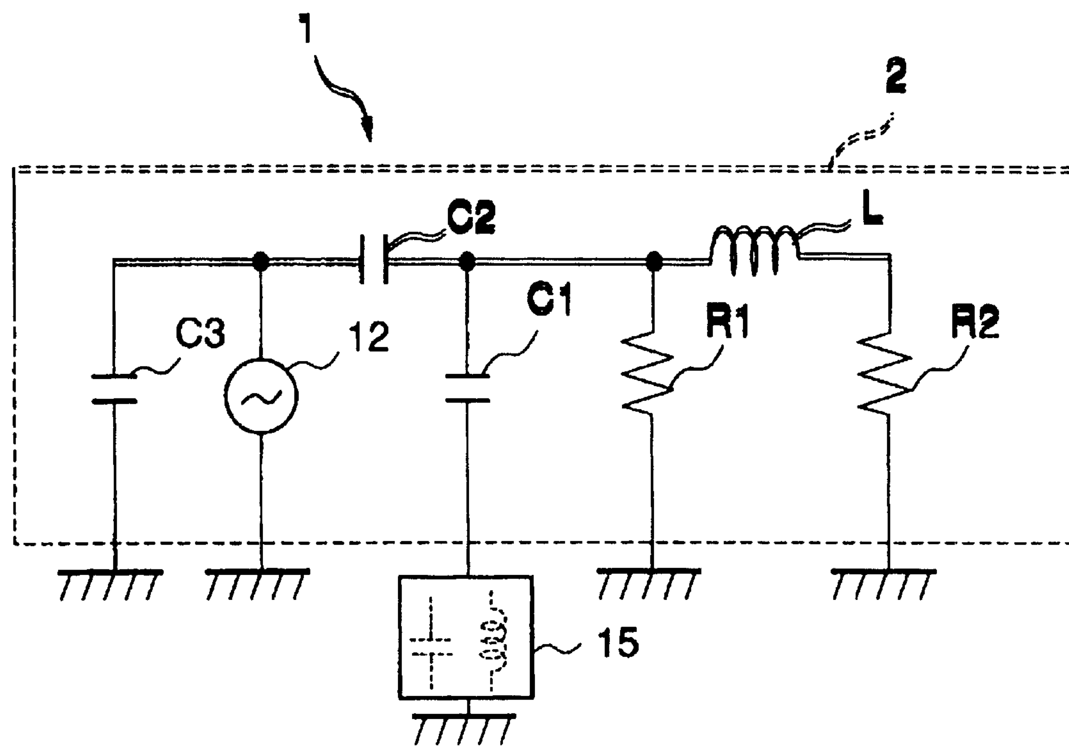
FIG. 2 is an equivalent circuit diagram of the antenna structure in the first preferred embodiment of the present invention.
Figure 10B:
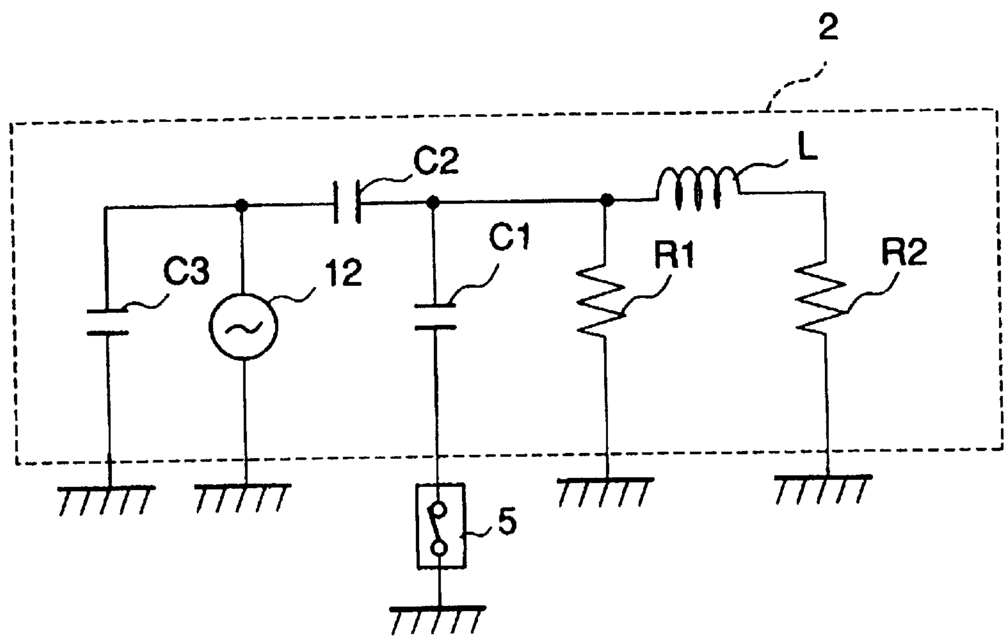
FIG. 10B is an equivalent circuit diagram of the antenna structure.

The resonant frequency adjuster 15 has at least one of an inductance and a capacitance. When the resonant frequency adjuster 15 is provided, the equivalent circuit of the antenna structure 1 of the first preferred embodiment is shown in a circuit diagram of FIG. 2. In the first preferred embodiment, a surface-mounted antenna 2 is a $\lambda/4$ transmission line type, and the equivalent circuit of the surface-mounted antenna 2 is similar to that of the proposed example shown in FIG. 10B. A capacitance C1 between an open end 8*a* of a radiating electrode 8 and an antenna-side control electrode 11 is grounded through the inductance or capacitance of the resonant frequency adjuster 15.

Accordingly, in the first preferred embodiment, between the open end 8*a* of the radiating electrode 8 and the ground, the capacitance C1 and an impedance due to the inductance or the capacitance of the resonant frequency adjuster 15 are provided. By changing the inductance or the capacitance of the resonant frequency adjuster 15, the impedance between the open end 8*a* of the radiating electrode 8 and the ground is changed. As a result, the resonant frequency of the radiating electrode 8 changes.

Figure 3:
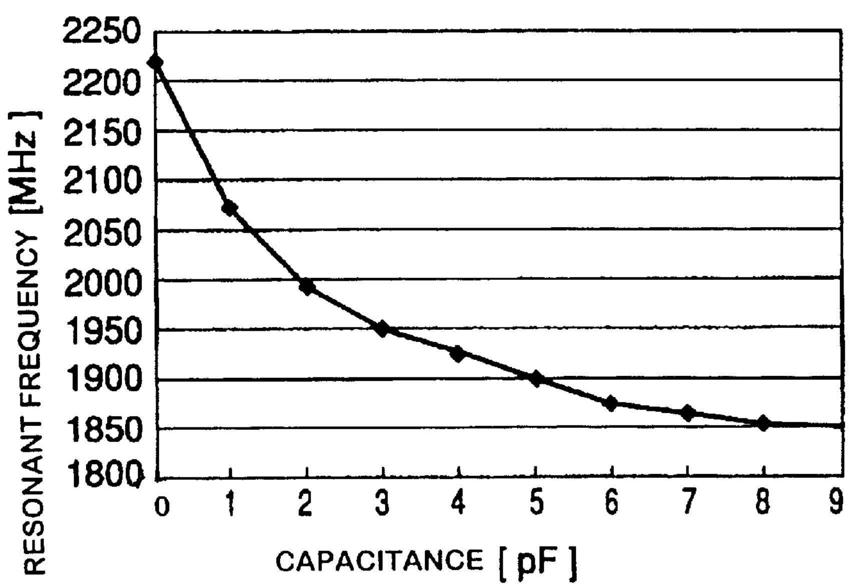
FIG. 3 is a graph showing the relationship between the capacitance of a resonant frequency adjuster and the resonant frequency of a radiating electrode.

Specifically, for example, when the resonant frequency adjuster 15 has a capacitance, as shown by a graph of FIG. 3, as the capacitance increases, the more the resonant frequency of the radiating electrode 8 decreases. When the resonant frequency adjuster 15 has an inductance, as the inductance increases, the resonant frequency of the radiating electrode 8 increases slightly.

The resonant frequency adjuster 15, which has at least one of the inductance and the capacitance, can have various configurations. Although the resonant frequency adjusting device 15 can have any of these configurations, a few specific configurations will be now described.

Figure 4A:
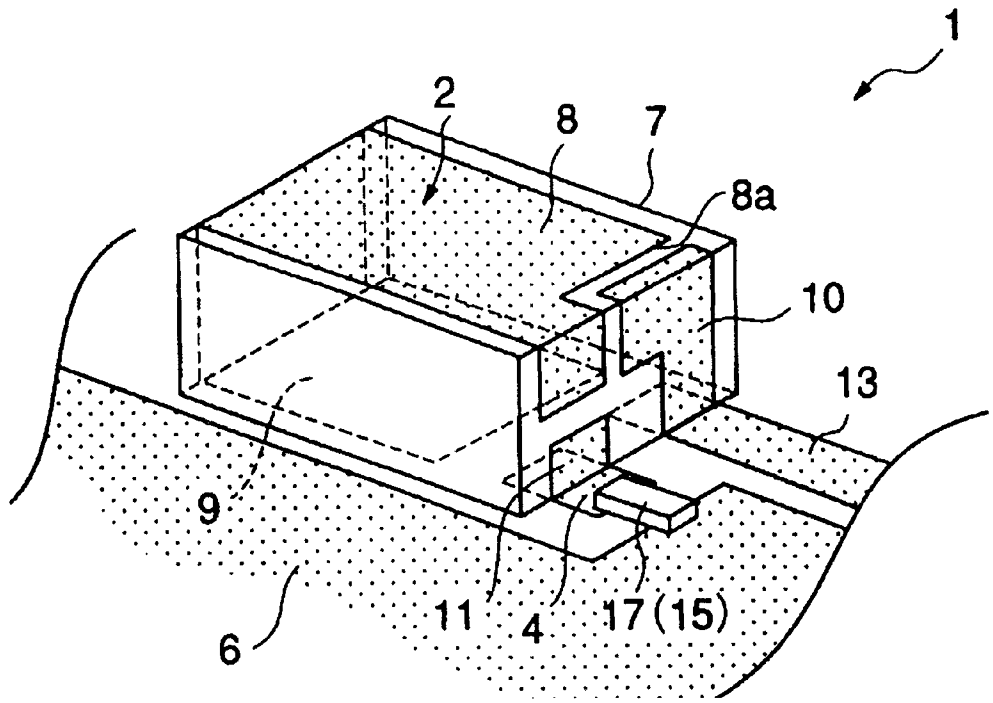
FIGS. 4A and 4B are model diagrams of examples of the resonant frequency adjuster, which is a feature of the first preferred embodiment of the present invention.

For example, FIG. 4A shows an example of the resonant frequency adjuster 15 including a chip component 17, such as a chip capacitor component or a chip inductor component. The chip component 17 has a predetermined constant, such as a capacitance of about 1 pF or a capacitance of about 2 pF. By exchanging the chip component 17, the capacitance or the inductance between the board-side control electrode 4 and the ground conductor 6 can be changed, thereby changing the resonant frequency of the radiating electrode 8.

Figure 4B:
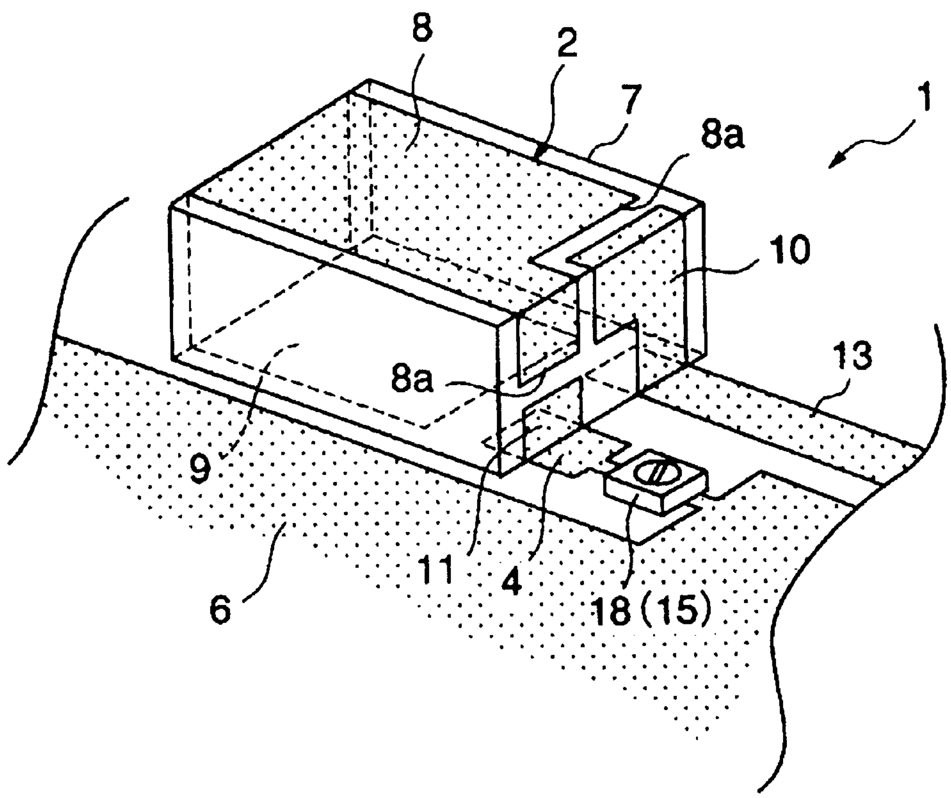

In an example shown in FIG. 4B, the resonant frequency adjuster 15 includes a chip component 18. In this example, the chip component 18 is arranged such that the inductance or the capacitance (high frequency impedance) thereof can be changed continuously or stepwisely. For example, the chip component 18 includes a varicap or a trimmer capacitor. In this case, the resonant frequency of the radiating electrode 8 can be easily changed without using a plurality of types of chip components having different constants by simply changing the high frequency impedance of the chip component 18.

When a varicap or a trimmer capacitor is used as the chip component 18, the capacitance can be continuously changed. Thus, the resonant frequency of the radiating electrode 8 can be continuously changed. It becomes even easier to adjust the resonant frequency to a desired resonant frequency.

Figure 5:
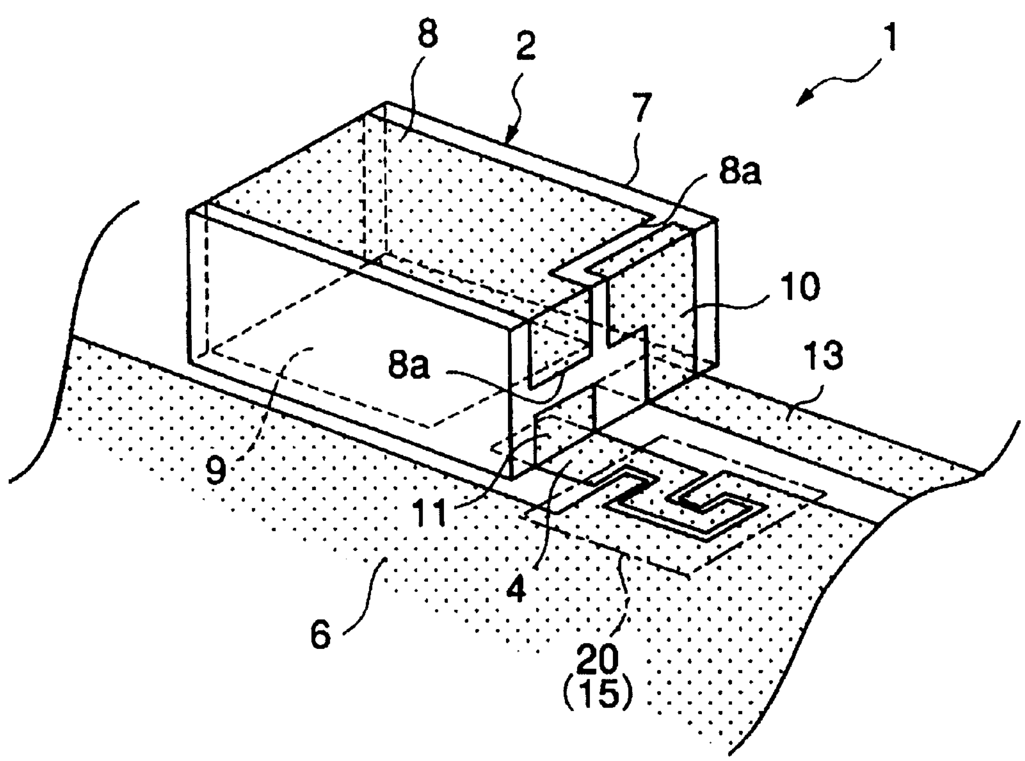
FIG. 5 is a model diagram of an example of the resonant frequency adjuster, which is the feature of the first preferred embodiment of the present invention.

In an example shown in FIG. 5, the resonant frequency adjuster 15 includes a circuit pattern 20 which has at least one of a capacitor pattern and an inductor pattern. In this case, by changing the pattern shape of the circuit pattern 20, the capacitance or the inductance can be changed. As a result, the resonant frequency of the radiating electrode 8 can be changed.

In this case, the resonant frequency adjuster 15, which includes the circuit pattern 20, can be disposed on the mounting board 3 together with the ground conductor 6 and a feeding wiring pattern 13 using film formation technology. Thus, the manufacturing process can be simplified. The circuit pattern 20 functioning as the resonant frequency adjuster 15 can have various shapes. The shape shown in FIG. 5 is only an example, and the shape of the circuit pattern 20 is not limited to that shown in FIG. 5.

There are various possible configurations for the resonant frequency adjuster 15, which has at least one of the capacitance and the inductance. The configuration of the resonant frequency adjuster 15 is not limited to those shown in FIGS. 4A, 4B, and 5. For example, the resonant frequency adjuster 15 may preferably include a combination of at least two of the chip component 17, the chip component 18, and the circuit pattern 20.

According to the first preferred embodiment of the present invention, the resonant frequency adjuster 15 for changing the resonant frequency of the radiating electrode 8 by changing the impendence between the open end 8*a* of the radiating electrode 8 and the ground is provided on the mounting board 3. The resonant frequency of the radiating electrode 8 can be changed without changing the size of a base member 7 of the surface-mounted antenna 2 or without changing the shape of the radiating electrode 8. Thus, the need to change the resonant frequency can be immediately satisfied without devoting a large amount of time and labor to design the antenna structure 1. As a result, the cost of the antenna structure 1 is greatly reduced. In the first preferred embodiment, the configuration of the resonant frequency adjuster 15 is simplified. Thus, the configuration of the antenna structure 1 can be simplified.

A second preferred embodiment of the present invention will now be described. In the second preferred embodiment, the resonant frequency adjuster 15 is disposed between the board-side control electrode 4 and the ground conductor 6. Unlike the first preferred embodiment, the resonant frequency adjuster 15 of the second preferred embodiment changes the resonant frequency of the radiating electrode 8 by providing a capacitance between the board-side control electrode 4 and the ground conductor 6 or by directly electrically connecting the board-control electrode 4 with the ground conductor 6. In the description of the second preferred embodiment, the configuration excluding the resonant frequency adjuster 15 is substantially similar to that of the first preferred embodiment. In the second preferred embodiment, the same reference numerals are given to elements corresponding to those of the first preferred embodiment, and descriptions of the common elements are omitted.

Figure 6A:
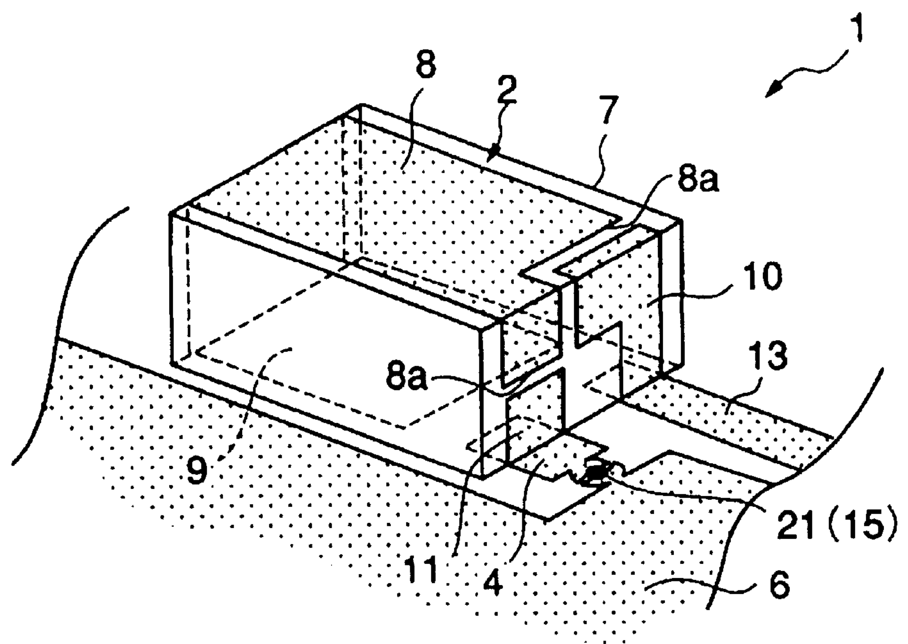
FIGS. 6A to 6C are model diagrams of a resonant frequency adjuster, which is a feature of a second preferred embodiment of the present invention.
Figure 6B:
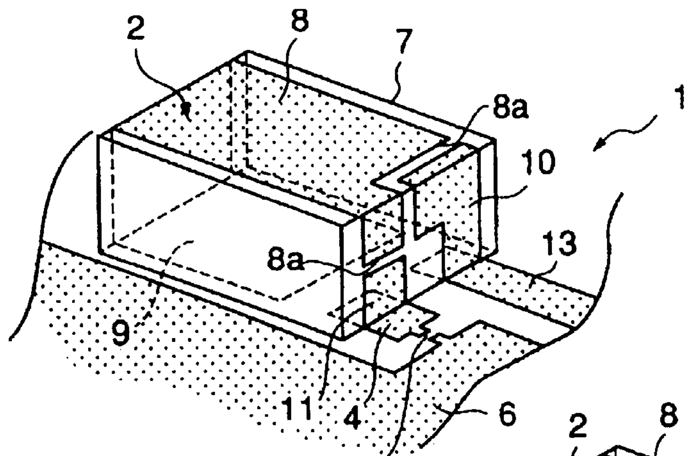
Figure 6C:
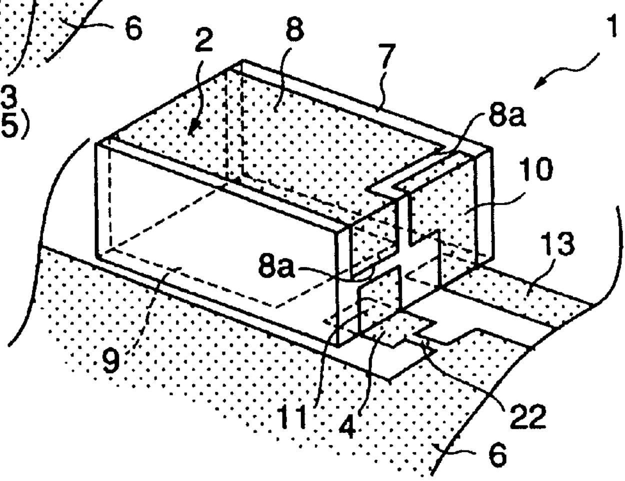

In the second preferred embodiment, the resonant frequency adjuster 15 can have configurations shown in FIGS. 6A to 6C. In an example shown in FIG. 6A, the board-side control electrode 4 and the ground conductor 6 have protrusions 4*a* and 6*a*, respectively, at opposing portions thereof. The protrusions 4*a* and 6*a* define a capacitor pattern. A solder bridge 21 is arranged to extend across the protrusions 4*a* and 6*a*.

In this case, there are two possible ways of changing the resonant frequency of the radiating electrode 8. First, the solder bridge 21 is arranged to directly electrically connect the board-side control electrode 4 with the ground conductor 6. Second, without providing the solder bridge 21, the capacitance of the capacitor pattern defined by the protrusions 4*a* and 6*a* of the board-side control electrode 4 and the ground conductor 6 is provided.

In an example shown in FIG. 6B, the resonant frequency adjuster 15 includes a capacitor 23 that is formed by cutting off a strip line 22 shown in FIG. 6C. In this case, the strip line 22 can directly electrically connect the board-side control electrode 4 with the ground conductor 6, and the strip line 22 can be cut off to form the capacitance of the capacitor 23, thereby changing the resonant frequency of the radiating electrode 8. Further, the amount of the strip line 22 cut off can be changed to change the capacitance of the capacitor 23, thereby changing the resonant frequency of the radiating electrode 8.

In the second preferred embodiment, as in the first preferred embodiment, the impedance between the open end 8*a* of the radiating electrode 8 and the ground can be changed by the resonant frequency adjuster 15 on the mounting board 3. As a result, the resonant frequency of the radiating electrode 8 can be easily changed without changing the surface-mounted antenna 2. The configuration of the resonant frequency adjuster 15 is simple, and complication of the antenna structure 1 is prevented.

A third preferred embodiment will now be described. In the description of the third preferred embodiment, the same reference numerals are given to elements corresponding to those of the foregoing preferred embodiments, and descriptions of the common elements are omitted.

Figure 7A:
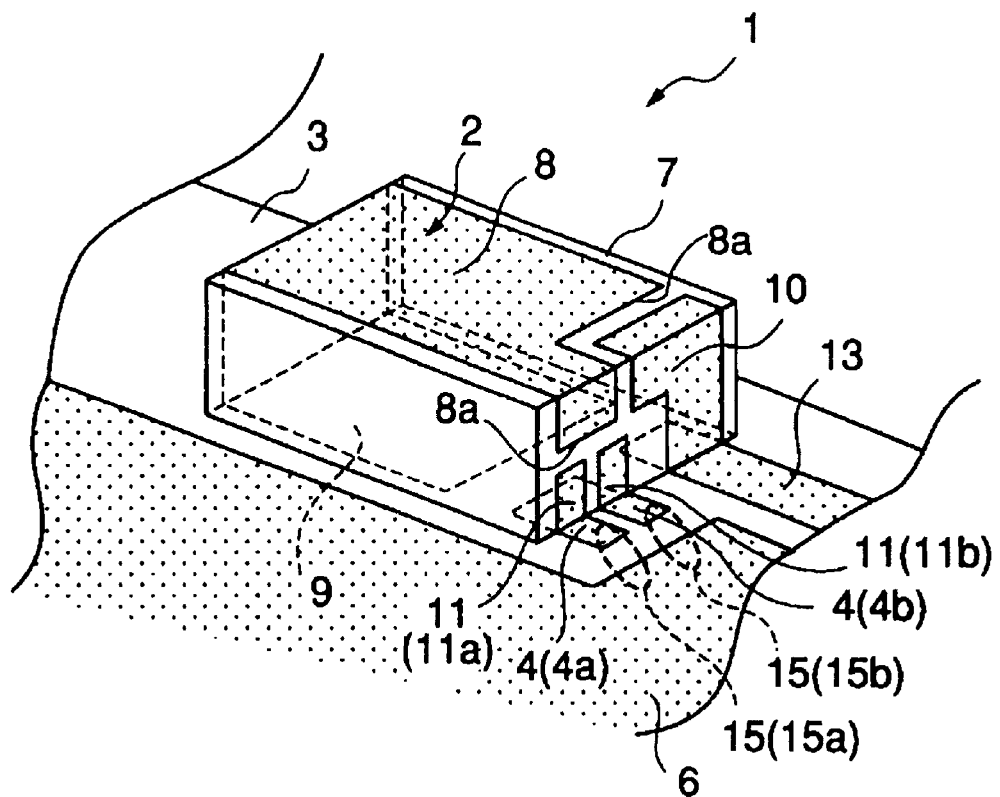
FIG. 7A is a model diagram of an antenna structure according to a third preferred embodiment and FIG. 7B is an equivalent circuit diagram of the antenna structure.

In the third preferred embodiment, as shown in FIG. 7A, the surface-mounted antenna 2 has a plurality of antenna-side control electrodes 11 (11*a* and 11*b*), which preferably includes two in an example shown in FIG. 7A. The mounting board 3 has board-side control electrodes 4 (4*a* and 4*b*) corresponding to the antenna-side control electrodes 11 (11*a* and 11*b*). The board-side control electrodes 4*a* and 4*b* are connected at high frequencies to the ground conductor 6 through separate resonant frequency adjusters 15 (15*a* and 15*b*). The resonant frequency adjusters 15*a* and 15*b* each have the configuration illustrated in the first preferred embodiment or the preferred second embodiment.

Figure 7B:
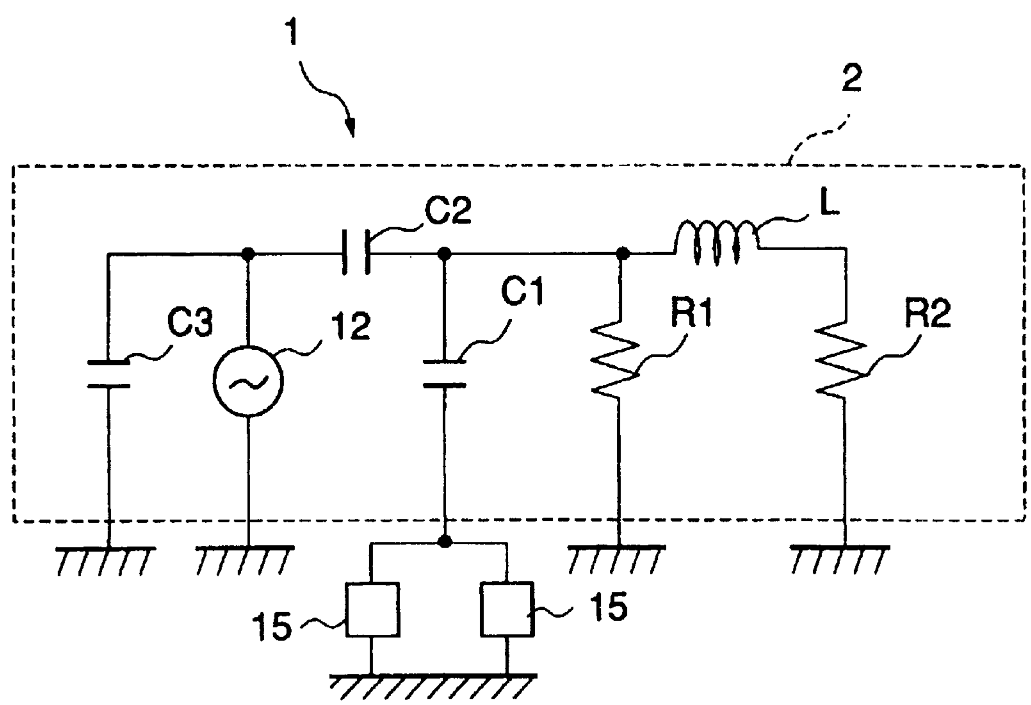

When arranged as described above, the equivalent circuit of the antenna structure 1 of the third preferred embodiment is shown in a circuit diagram of FIG. 7B. In the third preferred embodiment, the impedance between the open end 8*a* of the radiating electrode 8 and the ground is changed by changing the capacitance or the inductance of each resonant frequency adjuster 15, by providing the solder bridge 21, or by cutting off the strip line 22. As a result, the resonant frequency of the radiating electrode 8 can be changed.

In the third preferred embodiment, as in the foregoing preferred embodiments, the resonant frequency of the radiating electrode 8 can be easily changed without changing the surface-mounted antenna 2. Since a plurality of resonant frequency adjusters 15 is provided, the resonant frequency of the radiating electrode 8 can be finely adjusted.

The present invention is not limited to the foregoing preferred embodiments and can be implemented in various other embodiments. For example, although the radiating electrode 8 is preferably strip-shaped in the foregoing preferred embodiments, the shape of the radiating electrode 8 is not limited to a strip. For example, the shape of the radiating electrode 8 can be meandering or another suitable shape. Although the radiating electrode 8 is disposed on the surface of the base member 7, the location at which the radiating electrode 8 is provided can be appropriately determined. For example, the radiating electrode 8 can be set in the interior of the base member 7. The location at which the radiating electrode 8 is provided is not limited to specific locations.

Figure 8A:
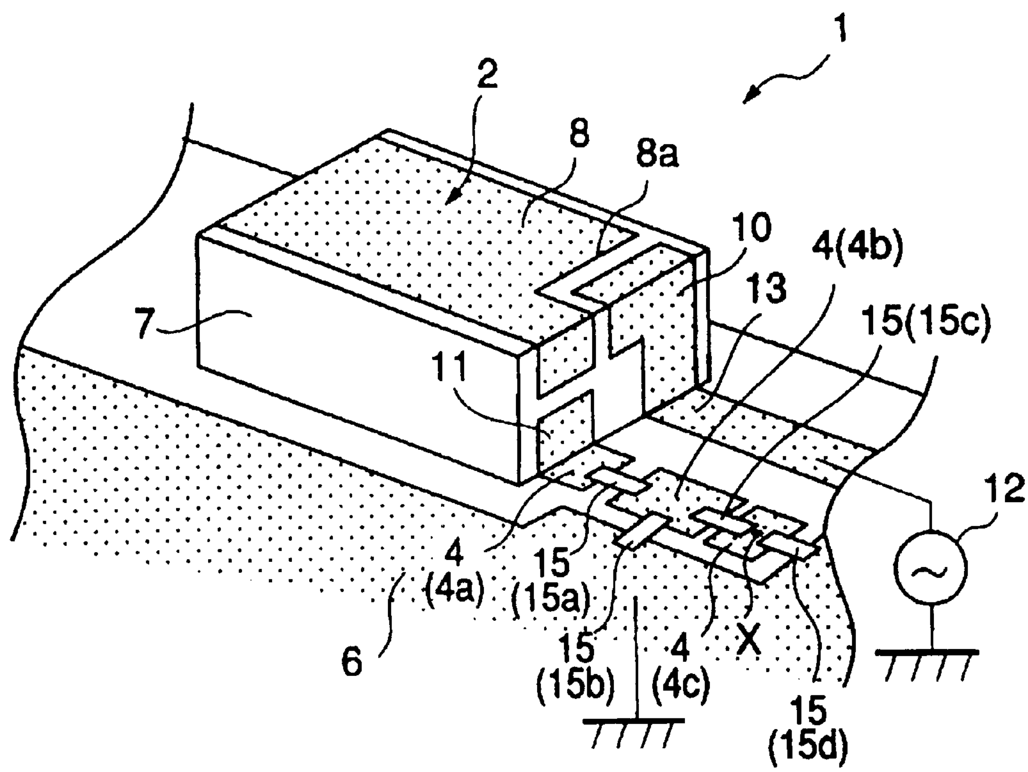
FIG. 8A is a model diagram of another example and FIG. 8B is an equivalent circuit diagram of the another example.

In the foregoing preferred embodiments, only one base-side control electrode 4 is provided on a high-frequency-signal conduction path extending from the antenna-side control electrode 11 to the ground conductor 6. For example, as shown in FIG. 8A, a plurality of board-side control electrodes 4 (4*a* to 4*c*) can be provided on the high-frequency-signal conduction path. In this case, for example, the adjacent board-side control electrodes 4 are electrically connected with each other at high frequencies through the resonant frequency adjuster 15 similar to those shown in the foregoing preferred embodiments. Accordingly, the number of the resonant frequency adjusters 15 increases, and hence the resonant frequency of the radiating electrode 8 can be finely adjusted in a simple manner.

Figure 8B:
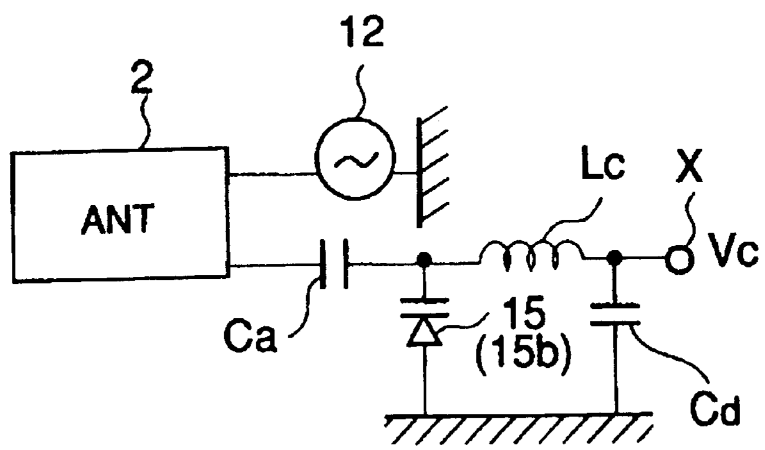
Figure 9:
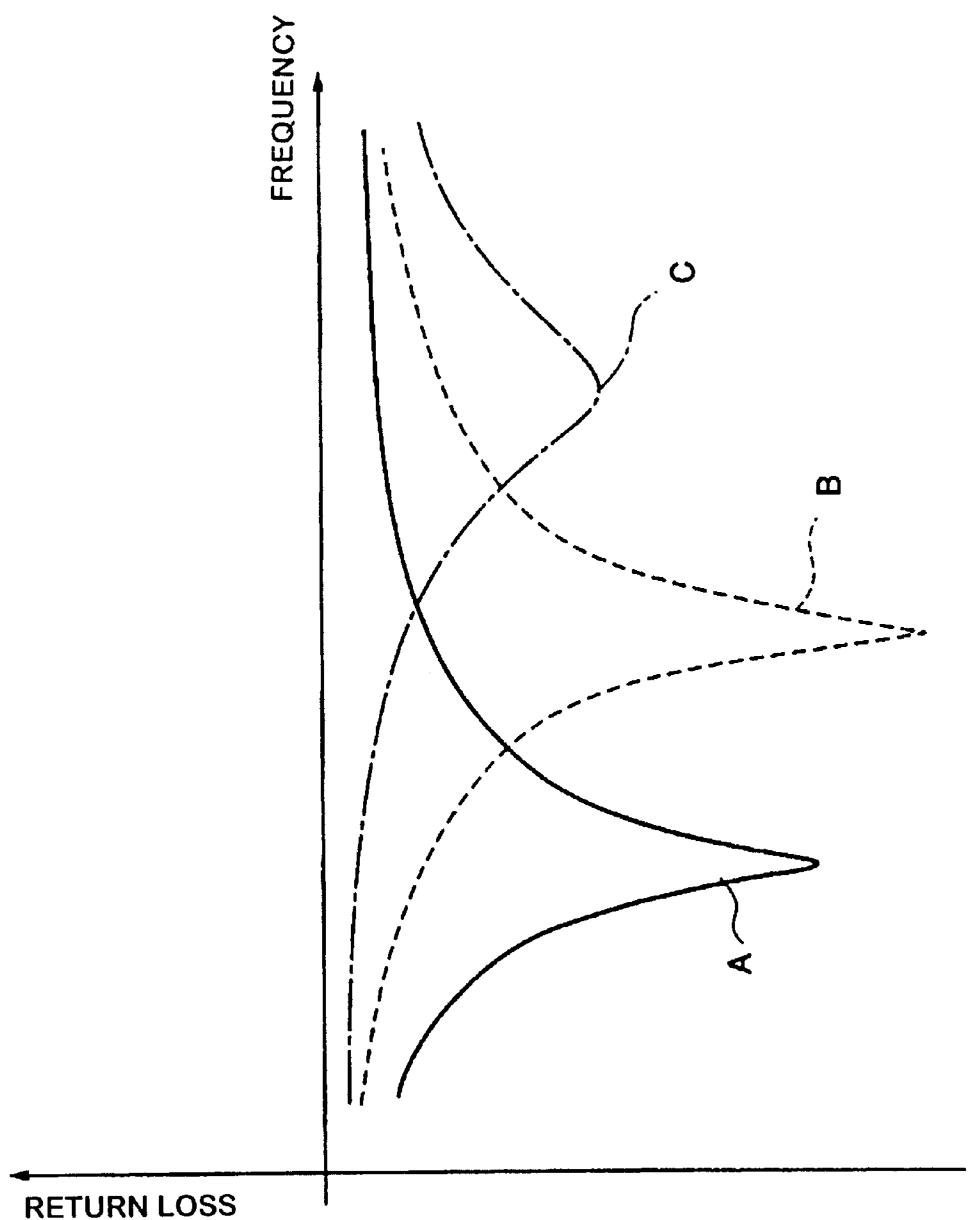
FIG. 9 is a graph showing how the resonant frequency of the radiating electrode changes when the voltage applied to the aviator diode, which is the resonant frequency adjuster, changes.

The resonant frequency adjuster 15 may preferably include a varicap diode. In this case, a connection section X for connecting to a voltage supply source Vc for applying a voltage to the varicap diode is provided. By changing and controlling the voltage applied from the voltage supply source Vc through the connection section X to the varicap diode, the resonant frequency of the radiating electrode 8 can be changed. FIG. 9 shows an example of a return loss characteristic indicating the relationship between the voltage applied to the varicap diode and the resonant frequency of the radiating electrode 8. The example of the return loss characteristic is obtained when the antenna structure 1 is constructed as shown in FIG. 8A and when the equivalent circuit of the antenna structure 1 is such as that shown in FIG. 8B. A resonant frequency adjuster 15*a* shown in FIG. 8A has a capacitance Ca. A resonant frequency adjuster 15*b* is a varicap diode. A resonant frequency adjuster 15*c* has an inductance Lc. A resonant frequency adjuster 15*d* has a capacitance Cd. The board-side control electrode 4*c* has a connection section X for connecting to the voltage supply source Vc for applying a voltage to the varicap diode.

Referring to FIG. 9, solid line A indicates a return loss characteristic when a voltage of 1 V is applied to the varicap diode, dotted line B indicates a return loss characteristic when a voltage of 2 V is applied to the varicap diode, and dotted and dashed line C indicates a return loss characteristic when a voltage of 3 V is applied to the varicap diode. As shown in FIG. 9, the larger the voltage applied to the varicap diode becomes, the higher the resonant frequency of the radiating electrode 8 becomes. In the third preferred embodiment, two board-side control electrodes 4 and two antenna-side control electrodes 11 are preferably provided. Alternatively, the number of the board-side control electrodes 4 and the number of the antenna-side control electrodes 11 can be three or greater and the number thereof is not limited.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. An antenna structure comprising:

a surface-mounted antenna including a base member and a radiating electrode disposed on said base member, the surface-mounted antenna being a λ/4 transmission line type, a first end of the radiating electrode being a ground end and a second end of the radiating electrode being an open end;

a mounting board on which the surface-mounted antenna is mounted;

an antenna-side control electrode disposed on the base member of the surface-mounted antenna, the antenna-side control electrode having a capacitance between itself and the open end of the radiating electrode;

a ground conductor disposed on the mounting board and defining a ground;

a board-side control electrode disposed on the mounting board, which is electrically connected with the antenna-side control electrode, and which electrically floats; and a resonant frequency adjusting member having at least one of an inductance and a capacitance, the board-side control electrode being electrically connected with the ground conductor through the resonant frequency adjusting member.

2. An antenna structure according to claim 1, wherein the resonant frequency adjusting member includes at least one of a chip inductor component, a chip capacitor component, an inductor pattern, and a capacitor pattern.

3. An antenna structure according to claim 1, wherein the resonant frequency adjusting member includes a combination of at least two of a chip inductor component, a chip capacitor component, an inductor pattern, and a capacitor pattern.

4. An antenna structure according to claim 1, wherein a plurality of antenna-side control electrodes are disposed on the base member of the surface-mounted antenna;

board-side control electrodes corresponding to the antenna-side control electrodes are disposed on the mounting board; and the board-side control electrodes are electrically connected with the ground conductor at high frequencies through separate resonant frequency adjusting members.

5. A communication apparatus comprising an antenna structure as set forth in claim 1.

6. An antenna structure according to claim 1, wherein the capacitance between the open end of the radiating electrode and the antenna-side control electrode is grounded through the at least one of the inductance and capacitance of the resonant frequency adjusting member.

7. An antenna structure according to claim 1, wherein the capacitance of the antenna side control electrode and an impedance due to the at least one of the inductance and the capacitance of the resonant frequency adjusting member are provided between the open end of the radiating electrode and the ground.

8. An antenna structure comprising:

a surface-mounted antenna including a base member and a radiating electrode disposed on said base member, the surface-mounted antenna being a λ/4 transmission line type, a first end of the radiating electrode being a ground end and a second end of the radiating electrode being an open end;

a mounting board on which the surface-mounted antenna is mounted;

an antenna-side control electrode disposed on the base member of the surface-mounted antenna, the antenna-side control electrode having a capacitance between itself and the open end of the radiating electrode;

a ground conductor disposed on the mounting board and defining a ground;

a board-side control electrode disposed on the mounting board, which is electrically connected with the antenna-side control electrode, and which electrically floats; and a resonant frequency adjusting member including a solder bridge connecting the board-side control electrode and one of the ground conductor or a strip line, the board-side control electrode being electrically connected with the ground conductor at high frequencies through the resonant frequency adjusting member.

9. An antenna structure according to claim 8, wherein a plurality of antenna-side control electrodes are disposed on the base member of the surface-mounted antenna;

board-side control electrodes corresponding to the antenna-side control electrodes are disposed on the mounting board; and the board-side control electrodes are electrically connected with the ground conductor at high frequencies through separate resonant frequency adjusting members.

10. A communication apparatus comprising an antenna structure as set forth in claim 8.

11. An antenna structure according to claim 8, wherein the board-side control electrode and the ground conductor have protrusions and the protrusions define a capacitor pattern.

12. An antenna structure according to claim 11, wherein the solder bridge is arranged to extend across the protrusions.

13. An antenna structure comprising:

a surface-mounted antenna including a base member and a radiating electrode disposed on said base member, the surface-mounted antenna being a λ/4 transmission line type, a first end of the radiating electrode being a ground end and a second end of the radiating electrode being an open end;

a mounting board on which the surface-mounted antenna is mounted;

an antenna-side control electrode disposed on the base member of the surface-mounted antenna, the antenna-side control electrode having a capacitance between itself and the open end of the radiating electrode;

a ground conductor disposed on the mounting board and defining a ground;

a board-side control electrode disposed on the mounting board, which is electrically connected with the antenna-side control electrode, and which electrically floats;

a resonant frequency adjusting member including a varicap diode, the board-side control electrode being electrically connected with the ground conductor at high frequencies through the resonant frequency adjusting member; and a connection section connecting to a voltage supply source for applying a voltage to the varicap diode.

14. An antenna structure according to claim 13, wherein a plurality of antenna-side control electrodes are disposed on the base member of the surface-mounted antenna;

board-side control electrodes corresponding to the antenna-side control electrodes are disposed on the mounting board; and the board-side control electrodes are electrically connected with the ground conductor at high frequencies through separate resonant frequency adjusting members.

15. A communication apparatus comprising an antenna structure as set forth in claim 13.

* * * * *